United States Patent [19]

Suzuki et al.

[11] Patent Number: 5,065,941

[45] Date of Patent: Nov. 19, 1991

[54] APPARATUS FOR CARRYING OUT CONNECTION AND DISCONNECTION OF A CIRCUIT MEMBER TO AN ELECTRICAL CONNECTOR

[75] Inventors: Takao Suzuki; Atsuhito Noda; Mitsuo Komoto; Shoji Umesato, all of Tokyo, Japan

[73] Assignees: Japan Aviation Electronics Industry, Ltd.; NEC Corporation, both of Japan

[21] Appl. No.: 467,744

[22] Filed: Jan. 19, 1990

[30] Foreign Application Priority Data

Jan. 20, 1989 [JP] Japan ................................. 1-4484[U]

[51] Int. Cl.[5] ............................................ H01R 13/15
[52] U.S. Cl. ..................................... 439/264; 439/266
[58] Field of Search ............... 439/259, 260, 261, 262, 439/264, 266, 267

[56] References Cited

U.S. PATENT DOCUMENTS 4,314,736  2/1982  Demnianiuk .................. 439/264

Primary Examiner—Larry I. Schwartz
Assistant Examiner—J. Daulton
Attorney, Agent, or Firm—Laff, Whitesel, Conte & Saret

[57] ABSTRACT

An apparatus for carrying out connection and disconnection of circuit member to an electrical connector has an inner frame for regulating a space for a circuit to be mounted, an outer frame, disposed outside the inner frame, for supporting the inner frame in such a manner as to move the inner frame in a predetermined direction only, a wedge member which is disposed between the outer frame and the inner frame in such a fashion as to be movable in a direction normal to the predetermined direction, and which moves the inner frame in the predetermined direction when the wedge member is moved, and a drive apparatus for externally driving the wedge member.

3 Claims, 5 Drawing Sheets 5,065,941

APPARATUS FOR CARRYING OUT CONNECTION AND DISCONNECTION OF A CIRCUIT MEMBER TO AN ELECTRICAL CONNECTOR

BACKGROUND OF THE INVENTION

The present invention relates to an apparatus for carrying out connection and disconnection of a circuit member, namely, a printed-board-shaped circuit such as an IC of LSI circuit package to an electrical connector.

A conventional connector is employed for mounting a board-shaped circuit such as an LSI package including a number of terminal pins on one surface thereof as shown in FIGS. 6 to 8. The connector shown in these figures comprises a cover 5 and a base 7 which are made of insulating material. In the cover 5, a plurality of first pin holes 9 for allowing pin terminals 1 to be inserted therein is formed in the configuration of a matrix. In the base 7, a number of second pin holes 13 for allowing the top end of each pin terminal 1 to be loosely inserted therein are also formed in the configuration of a matrix. In each of the second pin holes 13, there is disposed a contact 11 which can be brought into contact with the pin terminal 1.

In this connector, when a LSI package 3 is mounted on the cover 5 in such a manner that the top end of each pin terminal 1 of the LSI package 3 is passed through the corresponding first pin hole 9 until the top end of the pin terminal 1 is loosely fitted into the corresponding second pin hole 13, and a crank lever 15 is rotated counterclockwise in FIG. 8, the cover 5 is moved by a distance corresponding to the step-up distance of the crank pin from the journal of a crank shaft 17, so that each pin terminal 1 is fitted into the corresponding contact 11 and thus the pin terminal 1 is electrically connected with the contact 11. In FIG. 8, reference numeral 19 indicates a substrate through which a lead wire (not shown) is inserted.

In the above connector, as the crank lever 15 is rotated, the cover 5 is moved and each pin terminal 1 is pushed into the corresponding contact 11. Therefore, when there is a large number of the contacts 11 and the pin terminals 1, the crank lever 15 cannot appropriately meet the increase of the fitting force.

SUMMARY OF THE INVENTION

It is therefore an object of this invention to provide an apparatus which is capable of connecting and disconnecting a connector with a small driving force even when the number of terminal pins is great.

Other objects of this invention will become clear as the description proceeds.

According to this invention, there is provided an apparatus for carrying out connection and disconnection of a circuit member to an electrical connector with the circuit member being moved in a first predetermined direction. The apparatus comprises an outer frame, an inner frame, a movable member, and driving means. The outer frame is for holding the electrical connector. The inner frame is for defining a space which is for containing the circuit member. The inner frame is disposed inside the outer frame to be movable in the first predetermined direction with a gap left between the outer and the inner frames in the first predetermined direction. The movable member is disposed in the gap and is movable in a second predetermined direction normal to the first predetermined direction. The movable member is for moving the inner frame in the first predetermined direction dependent on movement of the movable member in the second predetermined direction. The driving means is coupled to the outer frame and it is for driving the movable member in the second predetermined direction.

DESCRIPTION OF THE PREFERRED EMBODIMENT

Figure 6:
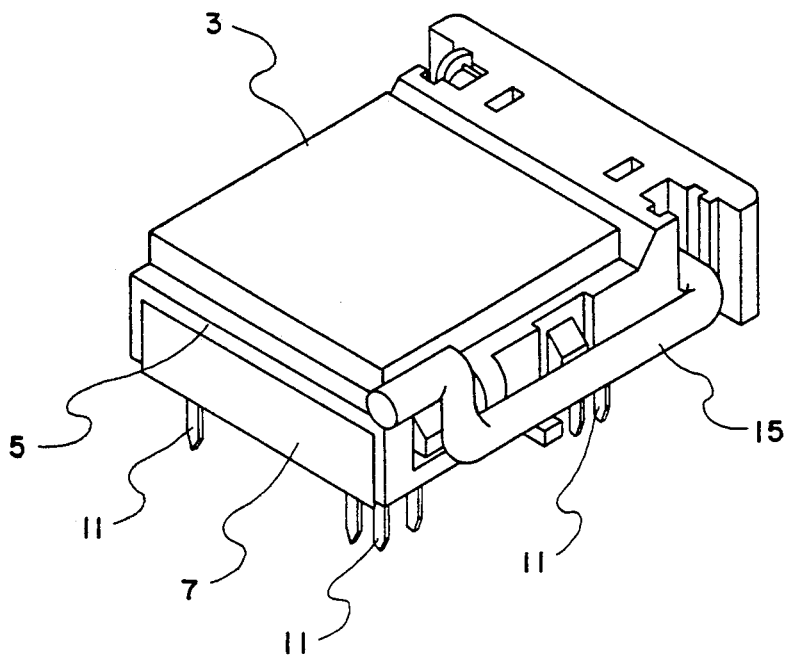
FIG. 6 is a perspective view of a conventional connector for use with board-shaped circuits, in which a board-shaped circuit has been incorporated.
Figure 7:
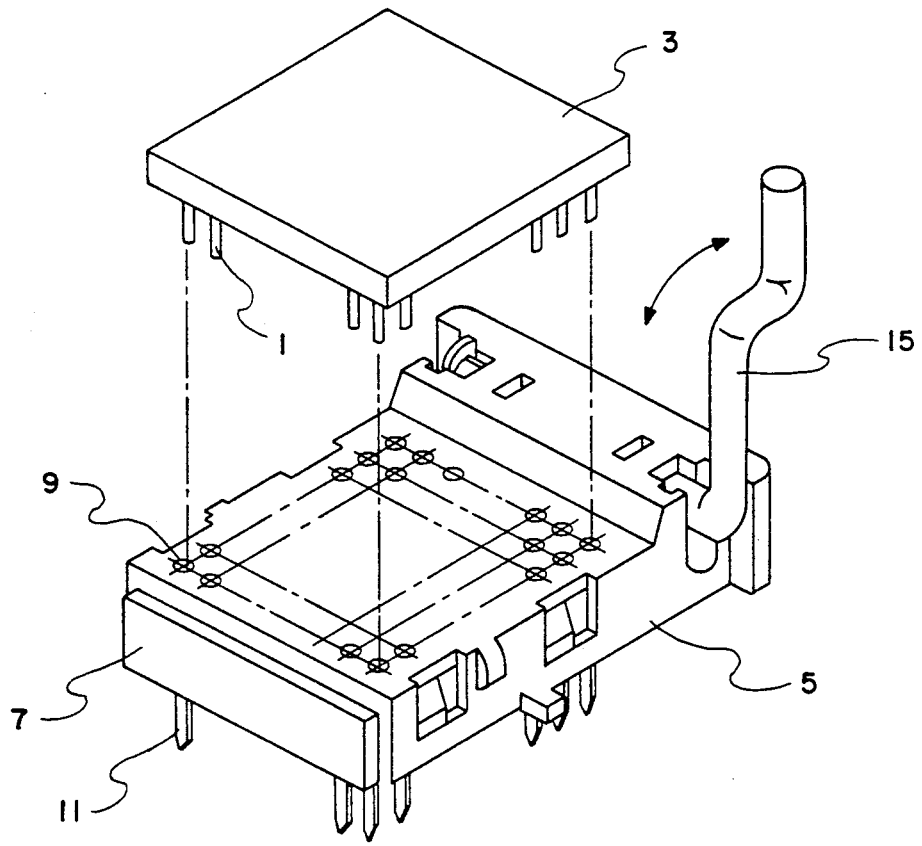
FIG. 7 is a perspective view of the conventional connector for use with board-shaped circuits prior to the incorporation of the board-shaped circuit in FIG. 6.
Figure 8:
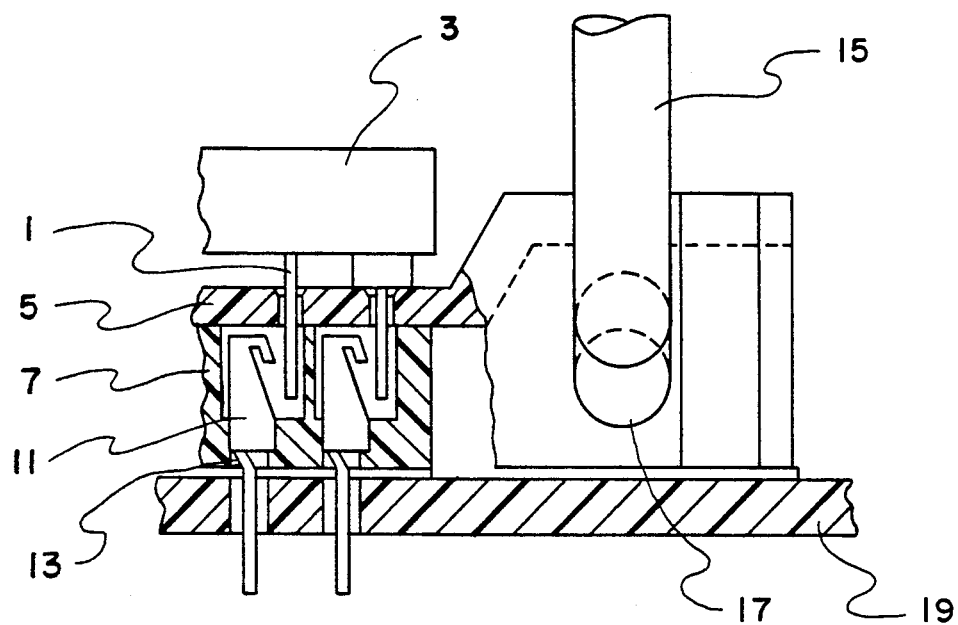
FIG. 8 is a partial cross-sectional view of the conventional connector prior to the rotation of a crank lever in FIG. 6.

With reference to FIGS. 1 to 5, an apparatus according to an embodiment of this invention will now be explained. Throughout these figures, the same reference numeral as in FIG. 1 designate identical or corresponding parts in FIGS. 6 through 8, and the explanation of the identical or corresponding parts is omitted.

Referring to FIGS. 1 to 5, the apparatus is for carrying out connection and disconnection of the LSI package 3 as a circuit member to an electrical connector 20 and includes an inner frame 21 and an outer frame 23. The inner frame 21 is for defining a space which is for containing the LSI package 3. The outer frame 23 is fixedly attached to a printed circuit board 19 via an insulating sheet 24. The inner frame 21 is designed to be movable relative to the outer frame 23 only in a first predetermined direction (i.e., in the lateral direction in FIG. 1). Namely, gaps 25 are left between the inner and the outer frames 21 and 23 in the first predetermined direction. The movement of the inner frame 21 can be carried out by moving a pair of wedges 27 incorporated between the outer frame 23 and the inner frame 21. Namely, each of the wedges 27 is for moving the inner frame in the first predetermined direction. The wedges 27 are movable only in a second predetermined direction (i.e., in the vertical direction in FIG. 1) normal to the first predetermined direction. Therefore, each of the wedges 27 is referred to as a movable member.

Figure 1:
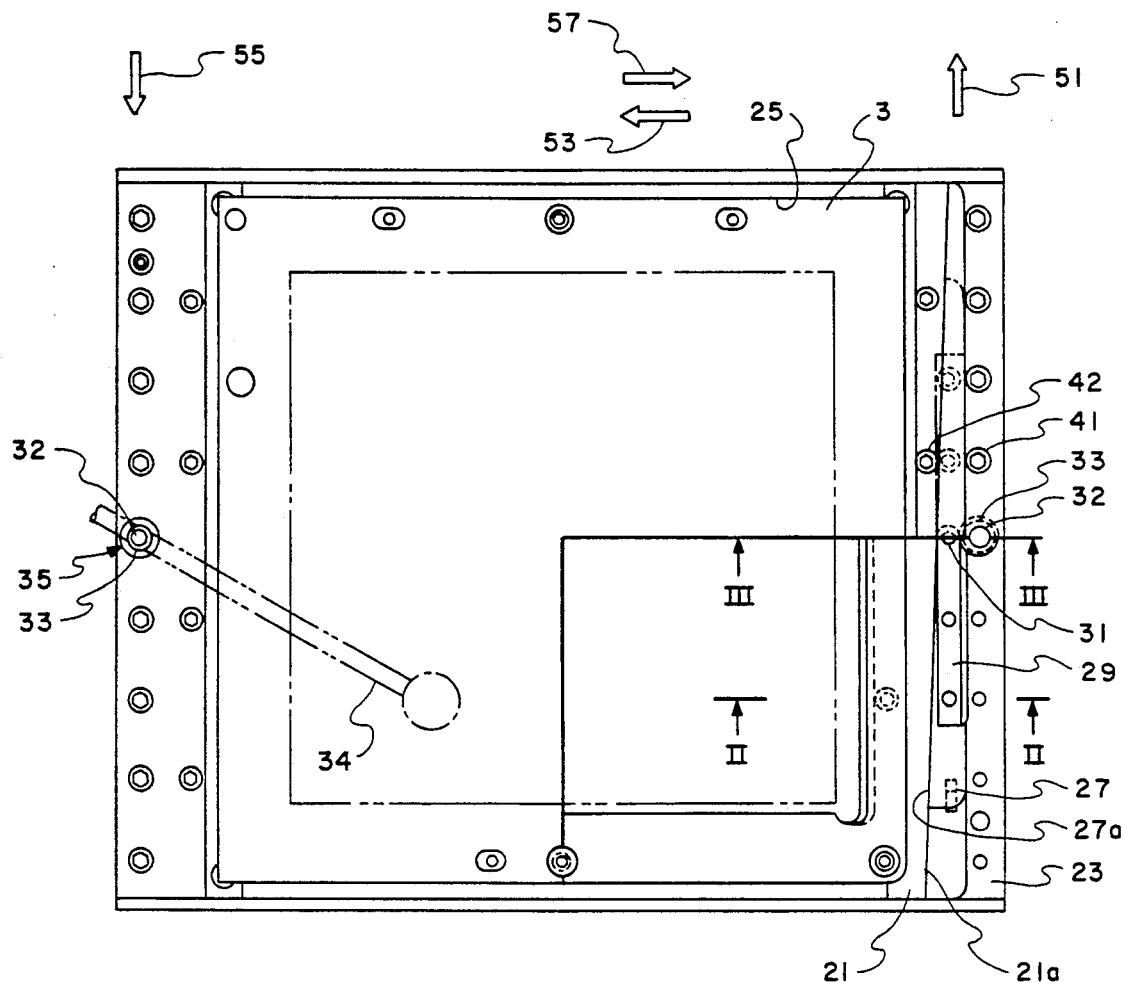
FIG. 1 is a plan view of an apparatus according to an embodiment of this invention, together with a board-shaped circuit which is cut off a part thereof.
Figure 2:
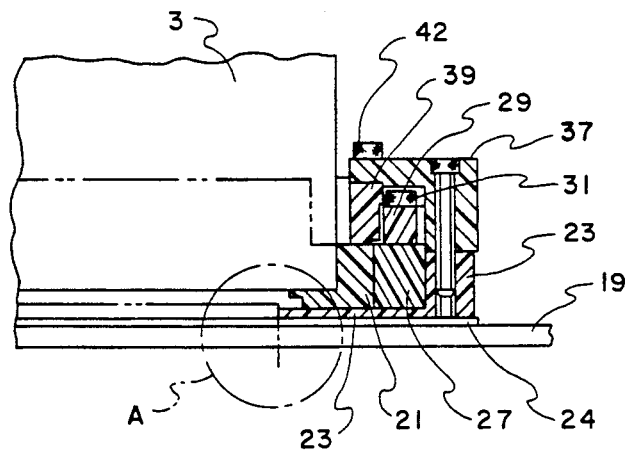
FIG. 2 is an enlarged cross-sectional view taken on line II—II in FIG. 1.
Figure 3:
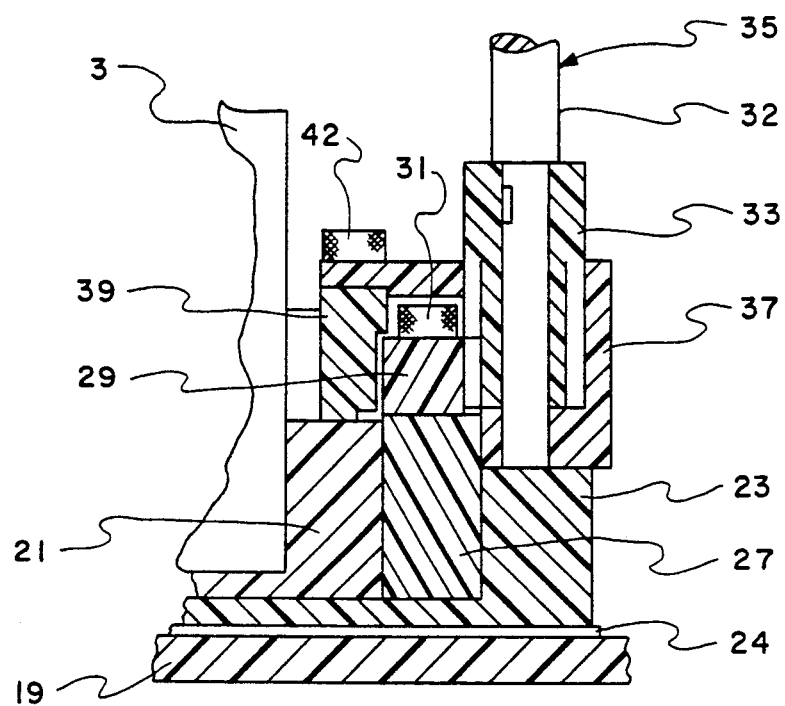
FIG. 3 is an enlarged cross-sectional view taken on line III—III in FIG. 1.
Figure 4:
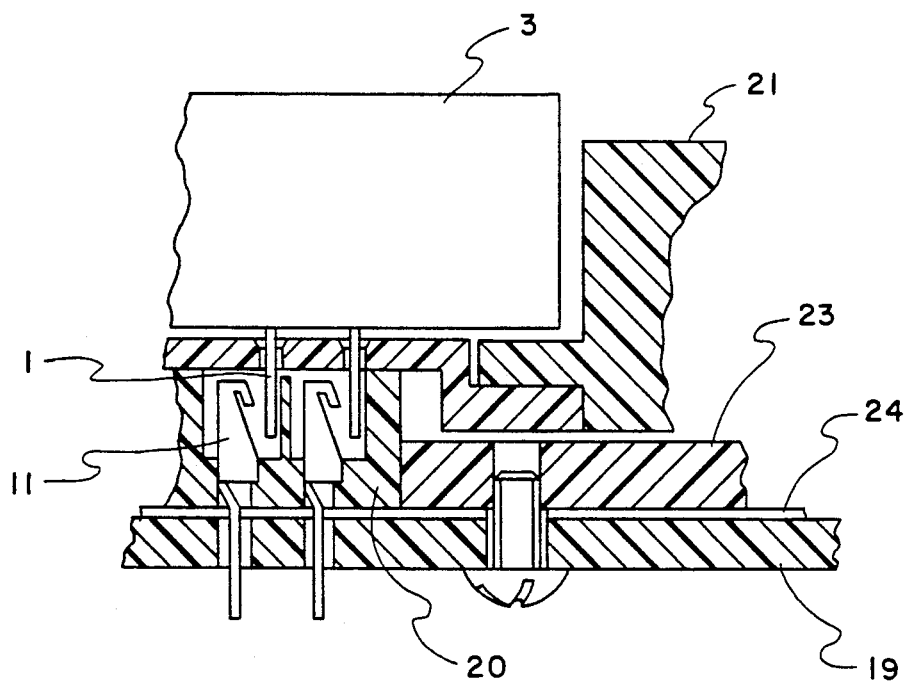
FIG. 4 is an enlarged cross-sectional view of a portion A in FIG. 2.
Figure 5:
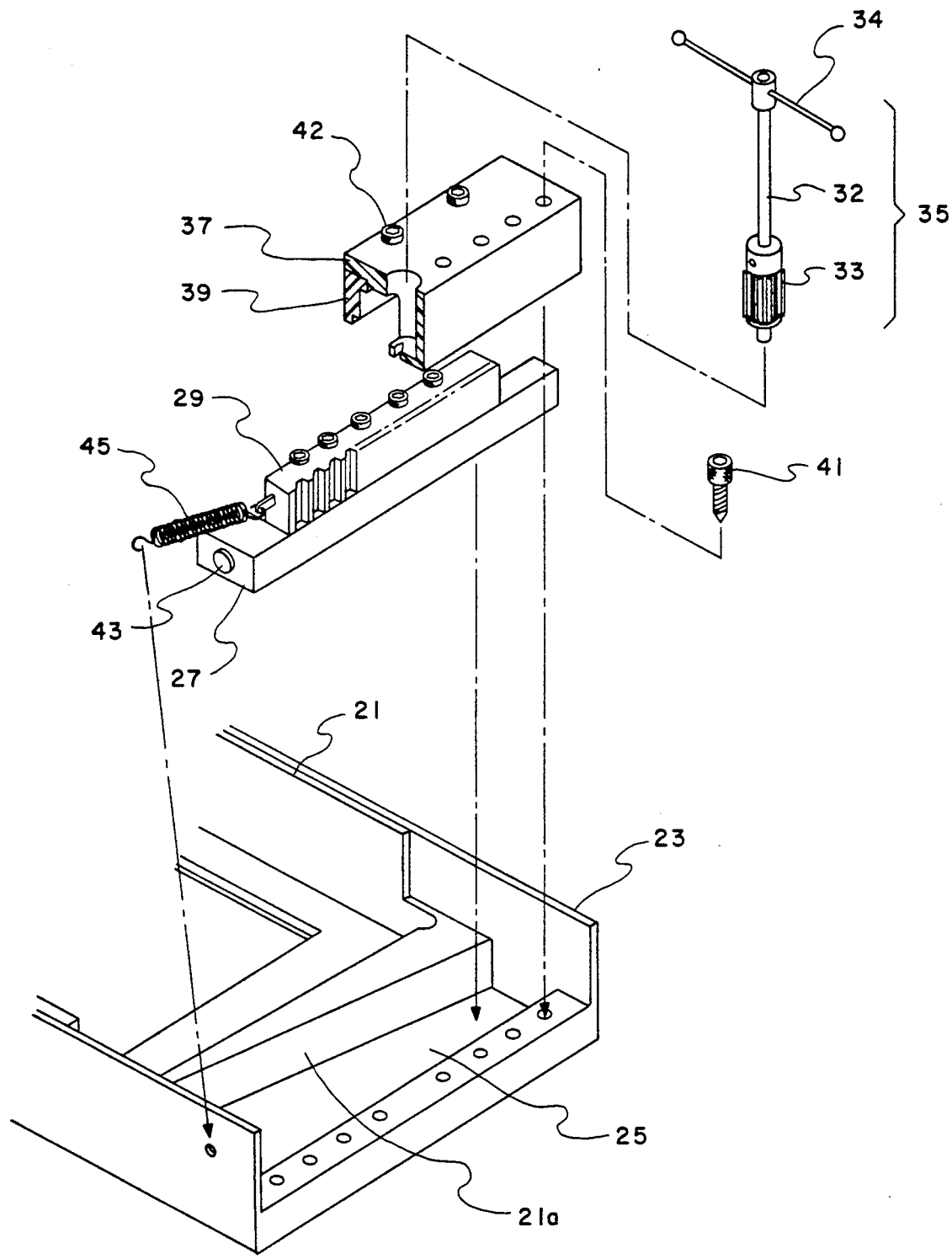
FIG. 5 is an exploded perspective view of the apparatus in FIG. 1.

As will be clear from FIG. 1, the inner frame 21 has end surfaces 21a which face the wedges 27 in the first predetermined direction, respectively. Each of the end surfaces 21a extends in a particular direction which is slightly inclined to the second predetermined direction. Each of the wedges 27 has a principal surface 27a which faces each of the end surfaces 21a of the inner frame 21 in the first predetermined direction. The principal surface 27a extends in the particular direction.

Each of the wedges 27 is integrally fixed with a rack 29 at the upper surface thereof by a bolt 31. The rack 29 extends along the upper surface of each of the wedges 27 in the second predetermined direction and is driven by a lever assembly 35.

It is a matter of course that the rack 29 has a plurality of teeth on a side surface thereof in the manner known in the art. Those teeth are arranged from end to end in the second predetermined direction. But a part of a group of the teeth is schematically depicted by a chain line in FIG. 5.

The lever assembly 35 comprises a shaft 32, a pinion 33, and a lever 34. The pinion 33 is fixed to a lower portion of the shaft 32. The lever 34 is held to an upper portion of the shaft 32. The rack 29 and the lever assembly 35 in combination are collectively referred to as a driving arrangement. The rack 29 engages with the pinion 33. The rack 29 is held at a predetermined position by a rack guide 37 and a cover 39.

The rack guide 37 is secured to the outer frame 23 by a bolt 41. The cover 39 is secured to the rack guide 37 by a bolt 42. The rack guide 37 is for holding the pinion 33 to secure the engagement of the rack 29 with the pinion 33. Thereafter, the rack guide 37 is referred to as a holding arrangement.

A damper 43 and a return spring 45 are attached to each of the racks 29. The return spring 45 is coupled to the rack 29 and the outer frame 23 and is for urging the rack 29 in the second predetermined direction. The damper 43 is for absorbing an impact between the inner frame 21 and each of the wedges 27 in the manner known in the art.

The operation of this apparatus will now be explained. The lever assembly 35 on the left side in FIG. 1 is rotated, so that the wedge 29 is moved in the second predetermined direction of an arrow 51. In accordance with this rotation of the lever assembly 35, the inner frame 21 is moved in the first predetermined direction of an arrow 53. At this moment, the pin terminals 1 of the LSI package 3 are moved to the position of the corresponding contacts 11, and fitted thereinto.

When the wedge 27 in FIG. 1 is moved in the direction opposite to the second predetermined direction of the arrow 51, the wedge 27 is released from the above-mentioned effect. Even when the wedge 27 returns to its initial position, the LSI package 3 remains fitted into the contact 11.

The pin terminal 1 can be detached from the contact 11 by driving the lever assembly 35 on the left side in FIG. 1 so as to move the wedge 27 in the direction of an arrow 55. At this moment, the inner frame 21 is moved in the direction of an arrow 57 in accordance with the same principle as mentioned above. As a result, the pin terminals 1 of the LSI package 3 are detached from the corresponding contacts 11.

Thus, in the apparatus according to the present invention, the wedges are provided between the inner frame and the outer frame, and by moving the wedges, the inner frame is moved so that a connector is connected or disconnected with a small driving force even when the number of terminal pins of the connector is great.

What is claimed is:

1. An apparatus for carrying out a connection and disconnection of a circuit member to and from an electrical connector with said circuit member being moved in a first predetermined direction, said apparatus comprising:

an outer frame for holding said electrical connector;
   an inner frame for defining a space for containing said circuit member, said inner frame being disposed inside said outer frame to be movable in said first predetermined direction with a gap left between said outer and said inner frames in said first predetermined direction;
   a movable member disposed in said gap and movable in a second predetermined direction which is normal to said first predetermined direction, said movable member moving said inner frame in said first predetermined direction dependent on movement of said movable member in said second predetermined direction; and
   driving means coupled to said outer frame and said movable member for driving said movable member is said second predetermined direction,
   said driving means further comprising:
   a rack member fixed to said movable member and having a plurality of teeth which are arranged in said second predetermined direction;
   a pinion member having a central axis normal to said second predetermined direction and a peripheral portion around said central axis, said peripheral portion being engaged with said teeth; and
   holding means coupled to said outer frame for holding said pinion member to said outer frame so that said pinion member is rotatable around said central axis.

2. An apparatus as claimed in claim 1, further comprising a lever connected to said pinion member for driving said pinion member.

3. An apparatus for carrying out connection and disconnection of a circuit member to an electrical connector with said circuit member movable in a first predetermined direction, said apparatus comprising:

an outer frame for holding said electrical connector;
   an inner frame for defining a space for containing a circuit member, said inner frame being disposed inside said outer frame to be movable in said first predetermined direction with a gap left between said outer and said inner frames in said first predetermined direction;
   a movable member disposed in said gap and movable in a second predetermined direction normal to said first predetermined direction, said movable member being for moving said inner frame in said first predetermined direction dependent on movement of said movable member in said second predetermined direction; and
   driving means coupled to said outer frame and said movable member for driving said movable member in said second predetermined direction;
   said driving means comprising,
   a rack member fixed to said movable member and extending in said second predetermined direction;
   a pinion member engaged with said rack member;
   holding means coupled to an outer frame member for holding said pinion member to said outer frame member; and
   urging means coupled to said rack member and said outer frame for urging said rack member in said second predetermined direction.

* * * * *

UNITED STATES PATENT AND TRADEMARK OFFICE
CERTIFICATE OF CORRECTION

PATENT NO. : 5,065,941
DATED : November 19, 1991
INVENTOR(S) : Takao Suzuki, et al It is certified that error appears in the above-identified patent and that said Letters Patent is hereby corrected as shown below:

Col. 4, line 19, "is" should be --in--.

Signed and Sealed this

Fourth Day of May, 1993

*Attest:*

MICHAEL K. KIRK

*Attesting Officer*   Acting Commissioner of Patents and Trademarks